United States Patent [19]

Hoko

[11] Patent Number: 5,131,976
[45] Date of Patent: Jul. 21, 1992

[54] JOSEPHSON JUNCTION APPARATUS FORMED ON FLEXIBLE POLYMERIC FILM AND PRODUCING METHOD THEREOF

[75] Inventor: Hiromasa Hoko, Sagamihara, Japan

[73] Assignee: Fujitsu Limited, Kawasaki, Japan

[21] Appl. No.: 611,789

[22] Filed: Nov. 13, 1990

[30] Foreign Application Priority Data

Nov. 13, 1989 [JP] Japan .................................. 1-294541
Jan. 24, 1990 [JP] Japan .................................. 2-014694

[51] Int. Cl.$^5$ .......................... B44C 1/22; C23F 1/02
[52] U.S. Cl. .................................... 156/630; 156/631; 156/634; 156/656; 156/659.1; 156/667; 204/192.24; 505/728; 505/817; 505/820
[58] Field of Search ............... 156/630, 631, 633, 634, 156/655, 656, 657, 659.1, 667; 427/62, 63; 204/192.24; 505/728, 817, 820

[56] References Cited

U.S. PATENT DOCUMENTS 3,409,466 11/1968 Slay et al. .............................. 427/63
4,412,902 11/1983 Michikami et al. ............... 427/63 X
4,956,335 9/1990 Agostinelli et al. ............... 427/62 X
4,964,945 10/1990 Calhoun ................................ 156/632
4,988,674 1/1991 Mir et al. ........................... 427/62 X

FOREIGN PATENT DOCUMENTS 0382661 8/1990 European Pat. Off. .

OTHER PUBLICATIONS

H. Shibayama et al., "Formation of Low Defect Density $SiO_x$ Film for Josephson Integrated Circuits", Appl. Phys. Lett. 47(4), pp. 429–430, Aug. 15, 1985.

Primary Examiner—William A. Powell
Attorney, Agent, or Firm—Staas & Halsey

[57] ABSTRACT

A Josephson junction apparatus comprises a polymeric film having flexiblity, and a Josephson junction circuit formed on the polymeric film. The Josephson junction circuit includes a Josephson junction device and a wiring for connecting to the Josephson junction device. Namely, the Josephson junction apparatus has flexibility, and thus the Josephson junction apparatus can be placed not only on a flat surface but also it can be placed on a curved surface in practice. Furthermore, in the Josephson junction apparatus, when a functional polymeric film is used as a substrate of a Josephson junction of the Josephson junction device, a protective film is previously formed over the functional polymeric film, so that a wetting of the functional polymer film, which is caused by water or organic solvents being used used repeatedly during the manufacturing process, can be prevented and a dimensional stability of the film can be increased. Therefore, a minute Josephson junction can be formed onto the polymeric film without causing a dimentional discrepancy in pattern, and a reliability thereof can be increased.

11 Claims, 9 Drawing Sheets

JOSEPHSON JUNCTION APPARATUS FORMED ON FLEXIBLE POLYMERIC FILM AND PRODUCING METHOD THEREOF

BACKGROUND OF THE INVENTION

1. Field of the Invention

The present invention relates to a Josephson junction apparatus and a producing method thereof, more particularly, to a technique for producing a Josephson junction device onto a very thin functional polymeric film and for easily mounting it on irregular surface of shaped objects.

2. Description of the Related Art

Recently, a Josephson junction apparatus including a Josephson junction device have been studied and developed. The Josephson junction device is used as a switching element and a magnetic sensor. Namely, the Josephson junction device is not only used as a switching element having characteristics of high speed switching and a low power consumption, but also the Josephson junction device is used as a magnetic sensor having characteristics of an extremely high magnetic sensitivity. Note, a Josephson integrated circuit (apparatus), which comprises Josephson junction devices and wirings, is provided as a logic circuit or a memory circuit by using the characteristics of the Josephson junction device as a switching element. Further, in recent years, a superconducting quantum interference device (SQUID) and a superconductor-insulator-superconductor (SIS) mixer, which are examples of the integrated Josephson junction apparatuses, have been studied and developed by using the characteristics of the Josephson junction device as a magnetic sensor. Note, the SQUID can detect a very weak magnetic field and has a characteristic of high speed response, and thus the SQUID is often used in a medical apparatus for detecting biomagnetism, and the like. Further, the SIS mixer can be also used as an electromagnetic wave receiver through space for radio astronomical observations.

In the related art, the Josephson junction apparatus is formed on a hard substrate such a silicon substrate or a quartz crystal substrate, so that the Josephson junction apparatus cannot be easily mounted on an irregularly shaped surface, i.e., a curved surface, and the like.

Furthermore, in the related art, when forming the Josephson junction device onto a functional polymeric film, a wetting of the functional polymeric film occurs, which is caused by water or organic solvents being used repeatedly during the manufacturing process, and a dimensional stability of the film is decreased. Consequently, a minute Josephson junction (Josephson junction device) cannot be formed onto the functional film without causing a dimensional discrepancy of a pattern, and the reliability thereof is accordingly decreased.

SUMMARY OF THE INVENTION

It is an object of the present invention to provide a Josephson junction apparatus formed on a flexible substrate. Another object of the present invention is to provide a method of producing the above described Josephson junction apparatus. Furthermore, still another object of the present invention is to provide a Josephson junction apparatus which is easily handled during the manufacturing process thereof. It is another object of the present invention to provide a Josephson junction apparatus having a minute Josephson junction device formed on a polymeric film without causing a dimensional discrepancy in pattern.

According to the present invention, there is provided a Josephson junction apparatus comprising: a polymeric film, having flexibility; and a Josephson junction circuit formed on the polymeric film, and the Josephson junction circuit including a Josephson junction device and a wiring for connecting to the Josephson junction device.

The polymeric film may be constituted by a functional polymeric film. The functional polymeric film may be made of polyimide. The thickness of the polymeric film can be specified from 7.5 $\mu$m to 125 $\mu$m.

Further, the functional polymeric film may be made of polyetheretherketone, polyphenylenesulfite, aramid, or polyethyleneterephthalate.

The Josephson junction apparatus may further comprise a protective film formed over both sides of the polymeric film. The protective film may be made of silicon oxide. The thickness of the protective film can be specified at about 300 nm. Further, the protective film may be made of calcium fluoride, barium fluoride, or magnesium fluoride. The wiring may be formed by a superconductor wiring layer.

According to the present invention, there is provided a method of producing a Josephson junction apparatus comprising: a step of providing a polymeric film, having high thermal resistance and flexibility; a step of physically depositing a laminated configuration portion constituted by a first superconductor layer, a barrier layer, and a second superconductor layer on the polymeric film at a specified temperature below the temperature at which a loss of the high thermal resistance of the polymeric film and of a stress-free state occurs, without heating the polymeric film; a step of forming a Josephson junction device by selectively etching the laminated configuration portion at a specified temperature below the temperature at which a loss of the high thermal resistance and of a stress-free state occurs; and a step of forming a superconductor wiring layer for connecting the Josephson junction device at a specified temperature below the temperature at which a loss of the high thermal resistance and of a stress-free state occurs.

The producing method may further comprise a step of forming a protective film over both sides of the polymeric film for protecting against wetting of the polymeric film caused by water or organic solvents, before the step of physically depositing the laminated configuration portion.

Furthermore, according to the present invention, there is also provided a method of producing a Josephson junction apparatus comprising: a step of providing a polymeric film, having high thermal resistance and flexibility; a step of bonding the polymeric film to a hard substrate by using an adhesive; a step of physically depositing a laminated configuration portion constituted by a first superconductor layer, a barrier layer, and a second superconductor layer on the polymeric film at a specified temperature below the temperature at which a loss of the high thermal resistance of the polymeric film occurs, without heating the polymeric film; a step of forming a Josephson junction device by selectively etching the laminated configuration portion at a specified temperature below the temperature at which a loss of the high thermal resistance occurs; a step of forming a superconductor wiring layer for connecting the Josephson junction device at a specified temperature below the temperature at which a loss of the high thermal resistance occurs by applying stress; and a step of peeling the polymeric film from the hard substrate by dissolving the adhesive.

The step of depositing the laminated configuration portion may include the condition of applying stress to obtain a curved polymeric film.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a Josephson junction apparatus according to the related are will be explained, with reference to FIGS. 1A to 1C.

Recently, in the related art, a Josephson junction apparatus used as an integrated circuit or a SQUID has been studied and provided by using a silicon substrate. Note, manufacturing processes of a silicon integrated circuit are used for producing the Josephson junction apparatus or a Josephson junction integrated circuit. Further, for example, a SIS mixer can be formed on a quartz crystal substrate, and the like. Namely, the Josephson junction apparatus is formed on a hard substrate such a silicon substrate or a quartz crystal substrate by using the manufacturing processes of the silicon integrated circuit, and then the substrate is cut off by using a dicing saw the same as that for a general semiconductor apparatus, to produce each unit of the Josephson junction apparatus.

Figure 1A:
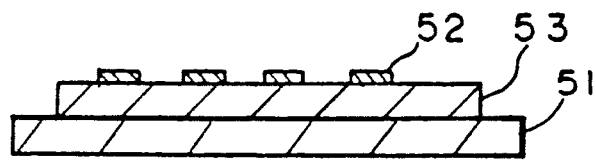
FIGS. 1A to 1C are sectional diagrams for explaining Josephson junction apparatuses according to the related art.
Figure 1B:
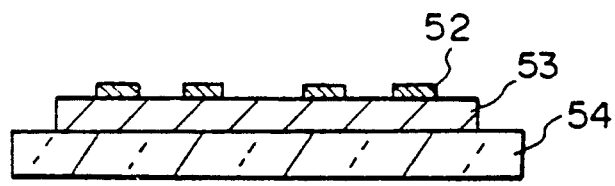
Figure 1C:
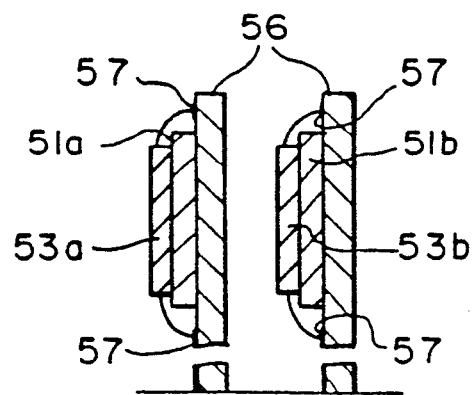

FIGS. 1A to 1C are sectional diagrams for explaining Josephson junction apparatuses according to the related art.

FIG. 1A shows a Josephson junction apparatus using a silicon substrate. As shown in FIG. 1A, a plurality of Josephson junction devices 52 are formed on a silicon substrate 51, and a Josephson integrated circuit 53 is constituted by connecting wirings among the Josephson junction devices 52. Note, this Josephson integrated circuit 53 is produced by using the manufacturing processes as that for producing a conventional silicon integrated circuit. Further, the silicon substrate 51 is cut from a silicon wafer having a large diameter, and the thickness of the silicon wafer, which may be specified in relation to the diameter thereof, is about 300 μm ~ 600 μm. In recent years, an integrated circuit, which comprises and combines a silicon device formed on the silicon substrate 51 and a Josephson junction device formed on the same silicon substrate 51, has also been studied and developed.

FIG. 1B shows an example of a Josephson junction apparatus formed on a quartz crystal substrate. As shown in FIG. 1B, a plurality of Josephson junction devices 52 are formed on a quartz crystal substrate 54, and a Josephson integrated circuit 53 is constituted by connecting wirings among the Josephson junction devices 52. Note, the thickness of the quartz crystal substrate 54 is, for example, specified at about 300 μm, and the quartz crystal substrate 54 is cut by a dicing saw after the Josephson integrated circuit 53 is formed thereon.

As shown in FIGS. 1A to 1C, the Josephson junction device is formed on a hard substrate such a silicon substrate or a quartz crystal substrate, and the like. When placing these Josephson junction apparatuses in practice, the substrates 51 and 54 should be placed on flat support surfaces of objects to fit the flat shape surfaces of the substrates.

Further, although silicon and quartz crystal have a characteristic of hard, they are also fragile. Therefore, for example, if the silicon substrate or the quartz crystal substrate is bumped with a hard object or dropped to the floor, these substrates may be broken.

FIG. 1C shows an example of producing a stereoscopic module by assembling a three-dimensional Josephson junction apparatus. For example, Josephson integrated circuits 53a and 53b, which are formed on silicon substrates 51a and 51b, are mounted on substrates 56 cooled at the temperature of liquid helium. Note, the silicon substrates 51a and 51b are mounted and wired on surfaces of the substrates 56. Further, the wirings between the Josephson integrated circuits 53a and 53b are constituted by using superconductor wiring means 57 formed on the surfaces of the substrates 56.

As described above, according to the related art, a Josephson junction apparatus is formed on a hard substrate such as a silicon substrate or a quartz crystal substrate. These substrates are formed with a flat shape, and thus they should be only placed on flat surface portions. Furthermore, these substrates made of silicon or quartz crystal are fragile, and care is required in handling them.

Next, a principle of a first aspect of the present invention will be explained.

According to the first aspect of the present invention, a Josephson junction device and a superconductor wiring are formed on a polymeric film having high thermal resistance and flexibility.

A laminated configuration portion, which is constituted by a superconductor layer (Nb layer), a barrier layer (AlO$_x$ layer), and a superconductor layer (Nb layer), is formed on the heatproof polymeric film at a specified temperature below the temperature at which a loss of the high thermal resistance of the polymeric film and of a stress-free state occurs. Further, the Josephson junction device is formed by selectively etching the laminated configuration portion at a specified temperature below the temperature at which a loss of the high thermal resistance and of a stress-free state occurs. Furthermore, required wirings are formed by a superconductor wiring layer.

The Josephson junction apparatus formed on the flexible polymeric film can be transformed by including it with a substrate (polymeric film). Therefore, in the case where a measuring objects has a curved surface, the Josephson junction apparatus can be placed on the curved measuring surface. Further, the Josephson junction apparatus can be stereoscopically mounted on the substrate by bending the substrate. Furthermore, the flexible polymeric film also has high thermal resistance, so that the Josephson junction apparatus can be formed on the polymeric film. Additionally, the Josephson junction device can be formed on the heatproof polymeric film while maintaining the substrate in a flat shape state, by forming a laminated configuration portion by a low temperature process and in a stress-free state, and by performing a selective etching process. Consequently, during the manufacturing process, no special care is required for handling.

Next, the preferred embodiments of a Josephson junction apparatus according to the first aspect of the present invention will be explained.

FIGS. 2A to 2D are sectional diagrams showing embodiments according to a first aspect of the present invention.

Figure 2A:
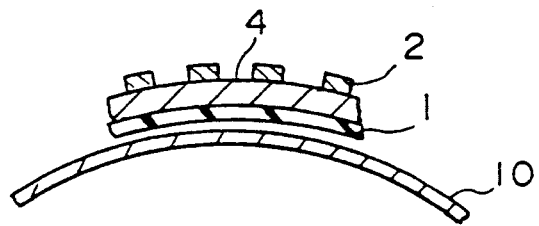
FIGS. 2A to 2D are sectional diagrams showing embodiments according to a first aspect of the present invention.

As shown in FIG. 2A, a plurality of Josephson junction devices 2 are formed on a polymeric film 1 having high thermal resistance and flexibility. A Josephson integrated circuit 4 is constituted by connecting superconductor wirings 5 (formed by a superconductor wiring layer 20) among the Josephson junction devices 2. Note, as shown in the drawings, the polymeric film 1 has flexibility, and thus the Josephson junction devices can be curvedly placed on a support member 10 having a convex curved surface.

For example, the polymeric film 1 is constituted by a polyimide film whose thickness is specified at about 100 μm. Note, the polyimide film has a heatproof characteristics up to about 300° C. Therefore, this Josephson junction apparatus can be produced by using a low-temperature process below a temperature of about 300° C.

Figure 2B:
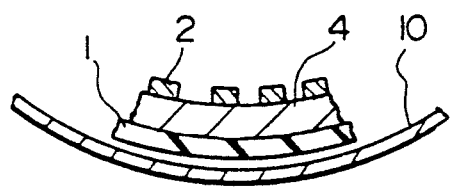

FIG. 2B shows a Josephson junction apparatus having the same configuration of that shown in FIG. 2A, with the Josephson junction apparatus placed on a concave curved surface. Note, if the substrate 1 has flexibility, the Josephson junction apparatus can be placed on either the convex curved surface shown in FIG. 2A, or the concave curved surface shown in FIG. 2B.

Figure 2C:
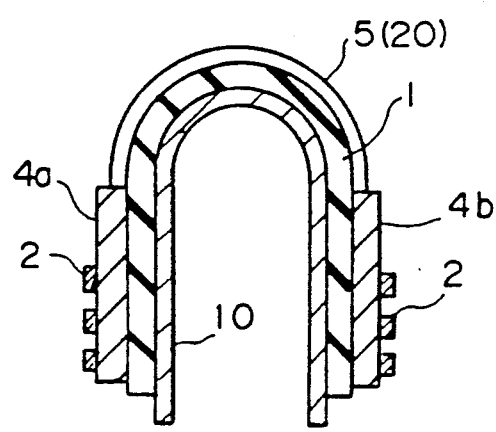

FIG. 2C shows a Josephson junction apparatus of another embodiment according to the first aspect of the present invention. Namely, both side portions of the support member 10 are formed as flat shape surfaces, and a middle portion of the support member 10 is formed as a curved surface. The polymeric film 1 having flexibility is laminated onto the surface of the support member 10, and Josephson junction circuits 4a and 4b including the Josephson junction devices 2 are formed on the flat shape surface portions corresponding to both side portions of the support member 10. Further, superconductor wirings 5 are formed on the curved portion of the support member 10.

Figure 2D:
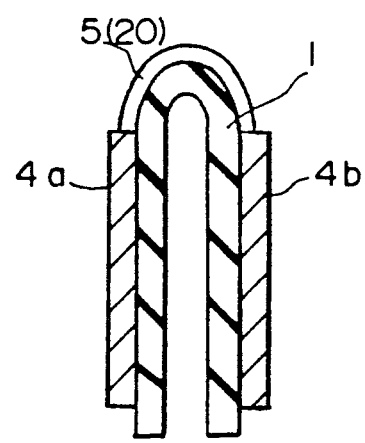

FIG. 2D shows a Josephson junction apparatus of still another embodiment according to the first aspect of the present invention. As shown in FIG. 2D, superconductor wirings 5 are formed on the middle portion of a polymeric film 1 having flexibility, and Josephson junction circuits 4a and 4b are formed on both surfaces of both sides of the polymeric film 1. Note, the Josephson junction circuits 4a and 4b are formed on the same side of the surface of the polymeric film 1. After these Josephson junction circuits 4a and 4b are formed, the polymeric film 1 is folded by bending the middle portion thereof, and the Josephson junction circuits 4a and 4b are laminated onto the surface of the support member 10. Note, an electrical connection is carried out between the Josephson junction circuits 4a and 4b, if it is required. As described above, a stereoscopic module assembled from the Josephson junction circuits in a three-dimensional arrangement is to be produced.

In the above embodiments, the polymeric film 1 used as a substrate of the Josephson junction apparatus should be comprised of materials which enable the formation of Josephson junction circuits 4a and 4b thereon. Namely, the high thermal resistance of the polymeric film 1 is specified to maintain the shape of the polymeric film 1 during the manufacturing process of the Josephson junction apparatus. For example, a baking temperature of the photoresist is specified below the temperature of 150° C., and a temperature of the sputtering process may be specified below the temperature of 200° C. Therefore, thermal resistance of the polymeric film 1 is specified at somewhat over 200° C. Furthermore, the polymeric film 1 should be resistant against organic solvents, acids, alkalis, and the like.

Namely, it is required for producing the Josephson junction apparatus that the polymeric film be resistant against organic solvents, acids, alkalis, and the like, and have thermal resistance against a temperature about of 200° C. Concretely, materials having the above conditions are, for example, polyimide, aramid, polyphenylenesulfite (PPS), polyetheretherketone (PEEK), polyethyleneterephthalate (PET), and the like.

Note, the thickness of the polymeric film (substrate) should be determined to have suitable flexibility and sufficient strength. For example, a preferable thickness of the polyimide film is specified at 7.5 μm ~ 125 μm. Further, a preferable thickness of the aramid film is specified at 1.5 μm ~ 100 μm, that of the PPS film is specified at 2 μm ~ 125 μm, that of the PEEK film is specified at 25 μm ~ 400 μm, and that of the PET film is specified at 1.5 μm ~ 500 μm.

When the Josephson junction circuit is formed on the above described polymeric film, and when cutting the Josephson junction apparatus from the polymeric film, the substrate is not as hard as the semiconductor integrated circuit of the related art, so that the substrate can be cut by shears or a cutter knife. Further, the shape of the substrate can be varied to have shapes other than only straight lines.

FIGS. 3A to 3D are plane diagrams showing plane shapes of a polymeric film having high thermal resistance and flexibility.

Figure 3A:
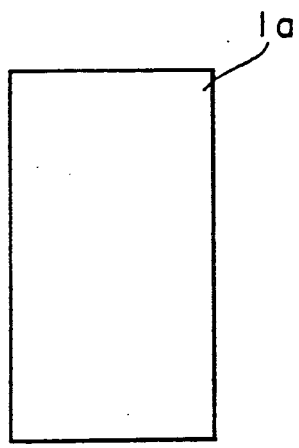
FIGS. 3A to 3D are plane diagrams showing plane shapes of a polymeric film.

FIG. 3A shows the case where a substrate 1a is cut in a rectangular shape in the same way as a general semiconductor integrated circuit. In FIG. 3A, an oblong shape is described, but the substrate can be also cut in a square shape.

Figure 3B:
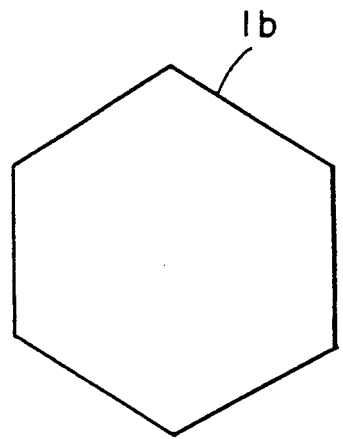

FIG. 3B shows the case where a substrate 1b is cut in a polygon shape. As shown in FIG. 3B, when cutting the substrate 1b in a hexagon shape, the hexagonal substrate 1b becomes suitable for forming Josephson junction circuits of a three-fold symmetry or a six-fold symmetry.

Figure 3C:
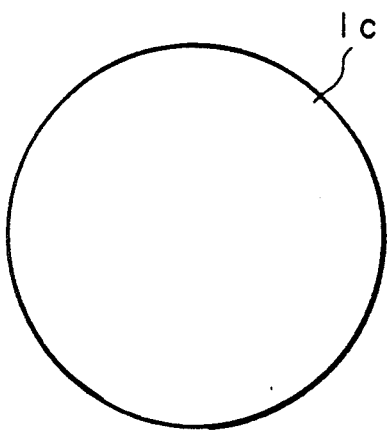

FIG. 3C shows the case where a substrate 1c is cut in a circular shape. In this case, the substrate has no corner.

Furthermore, the substrate need not be cut only in a regular shape, but it can also be cut in an irregular shape.

Figure 3D:
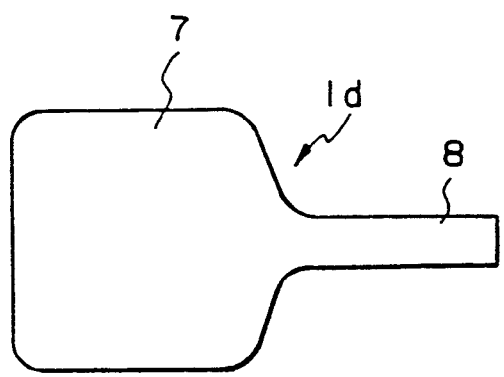

FIG. 3D shows the case where a circuit portion 7 of a substrate 1d is cut in a rectangular shape, a lead portion 8 of the substrate 1d is cut so as to be suitable for forming strip type lead lines from the circuit portion, and the cut substrate 1d forms a complex shape.

Note, it is obvious that the substrate can be cut in various shapes in accordance with special requirements, except for the shapes of the substrates 1a to 1d shown in FIGS. 3A to 3D.

In the above described Josephson junction apparatuses, it is preferable to use a material such niobium (Nb) for forming a film at a low temperature, as a Josephson junction should be formed in low temperature conditions. Therefore, a preferable method for forming a film is a physical deposition method such a sputtering method, vapor deposition method, and the like.

FIGS. 4A to 4J show manufacturing processes of an embodiment of a Josephson junction apparatus according to the first aspect of the present invention.

Figure 4A:
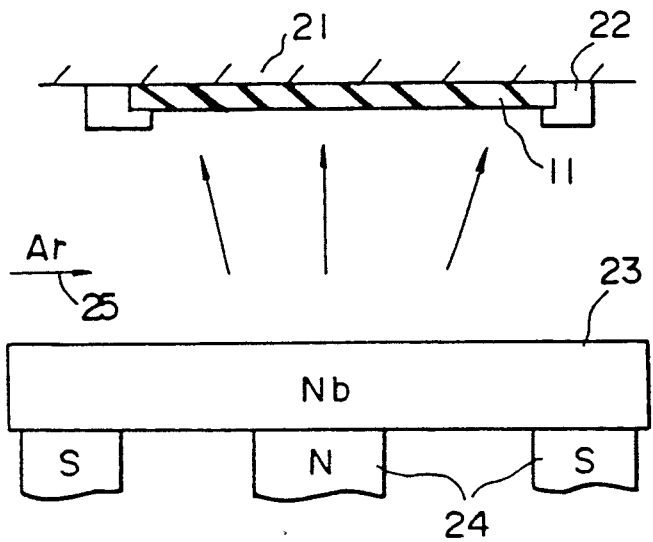
FIGS. 4A to 4J are sectional diagrams showing an example of a producing method of a Josephson junction apparatus according to the first aspect of the present invention.

FIG. 4A is a schematic diagram showing a magnetron sputtering process. For example, a polyimide film 11 whose thickness is about 50 μm is mounted onto a substrate support holder 21 and is fixed thereto by jigs 22. Further, a target 23 made of niobium (Nb) is located at a specific position, and magnetron sputtering is carried out in a magnetic field produced by magnets 24, and with the introduction of an argon (Ar) gas 25.

Figure 4B:
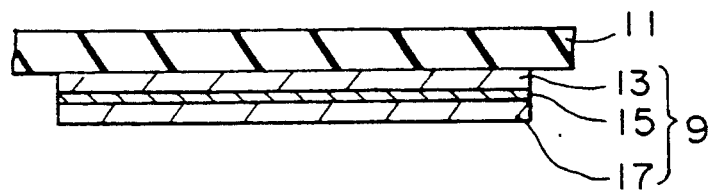

As shown in FIG. 4B, for example, an Nb layer (lower Nb layer) 13 whose thickness is about 200 nm (2000 Å) is formed onto the polyimide film 11 by using a magnetron sputtering method under the condition of an Ar gas pressure of 2.3 Pa (17 mTorr), a depositing speed of 150 nm/min. (1500 Å/min.), a direct current of 1.5 A, and in a stress-free state without heating the substrate. Next, an AlO$_x$ barrier layer 15 whose thickness is about 7 nm (70 Å) is formed onto the Nb layer 13 by using the magnetron sputtering method under the condition of an Ar gas pressure of 2.3 Pa (17 mTorr), a depositing speed of 10 nm/min. (100 Å/min.), a direct current of 0.1 A, and in stress-free state. Further, an Nb layer (upper Nb layer) 17 whose thickness is about 150 nm (1500 Å) is formed onto the AlO$_x$ barrier layer 15 by using a magnetron sputtering method under the condition of an Ar gas pressure of 2.3 Pa (17 mTorr), a depositing speed of 150 nm/min. (1500 Å/min.), a direct current of 1.5 A, and in a stress-free state.

Figure 4C:
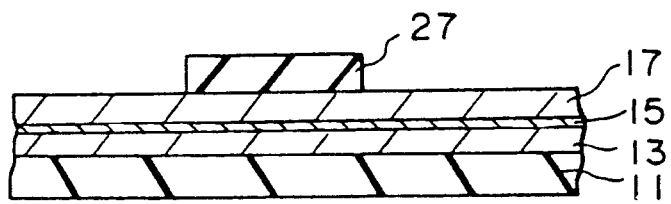

Note, in the above described embodiments, another kinds of films made of different materials can be used by changing the target of the magnetron sputtering method. Furthermore, a plurality of films made of different materials can be continuously formed without returning the pressure to atmospheric pressure. As shown in FIG. 4B, a laminated configuration portion is formed onto the polyimide film 11 by continuously depositing a lower Nb layer 13 whose thickness is about 200 nm (2000 Å), an AlO$_x$ barrier layer 15 whose thickness is about 7 nm (70 Å), and an upper Nb layer 17 whose thickness is about 150 nm (1500 Å). Next, as shown in FIG. 4C, a photoresist layer 27 is applied onto the laminated configuration portion, the photoresist layer is developed, and a resist mask 27 is formed.

Figure 4D:
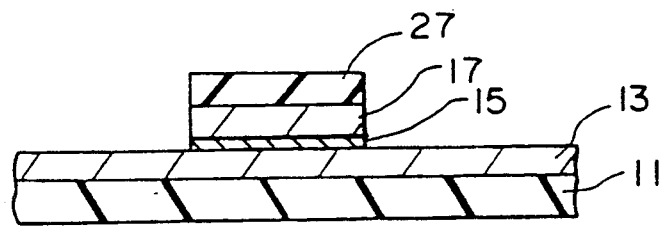

As shown in FIG. 4D, the upper Nb layer 17 and the AlO$_x$ barrier layer 15 are patterned by using the resist mask 27.

For example, an etching process of the upper Nb layer 17 is carried out by using a reactive ion etching (RIE) method under the condition of introducing carbon tetrafluoride (CF$_4$) gas of about 6.7 Pa (50 mTorr) including O$_2$ gas of 5% as etching gas, and the condition of applying a high frequency (13.56 MHz) power of about 50 W between plane parallel plate electrodes whose diameters are specified at about 280 mm.

Further, an etching process of the AlO$_x$ barrier layer 15 is carried out by using a similar plane parallel plate type RIE apparatus under the condition of introducing Ar gas of about 2 Pa (15 mTorr) as etching gas, and of applying a high frequency (13.56 MHz) power of about 100 W between the plane parallel plate electrodes. Under the above described conditions, no stress is caused at the laminated configuration portion formed on the polyimide film, and thus the polyimide film 11 is maintained in a flat shape.

Figure 4E:
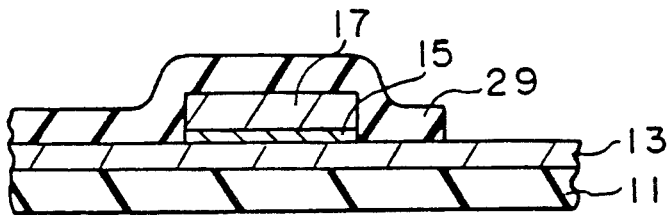

As shown in FIG. 4E, another resist mask 29 is formed on the laminated configuration portion where the upper Nb layer 17 and the AlO$_x$ barrier layer 15 are patterned. Note, this resist mask 29 is used to selectively etch the lower Nb layer 13.

Figure 4F:
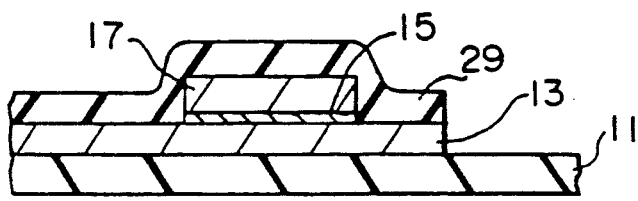

As shown in FIG. 4F, the lower Nb layer 13 is selectively etched by an RIE method by using the resist mask 29. Note, the conditions of this RIE method are the same as the above conditions, for example, the etching process is carried out under the condition of introducing CF$_4$ gas of about 6.7 Pa (50 mTorr) including O$_2$ gas of 5% as etching gas, and of applying a high frequency (13.56 MHz) power of about 50 W between plane parallel plate electrodes.

As described above, a Josephson junction having a specific shape is formed by patterning the upper Nb layer 17, the AlO$_x$ barrier layer 15, and the lower Nb layer 13.

Figure 4G:
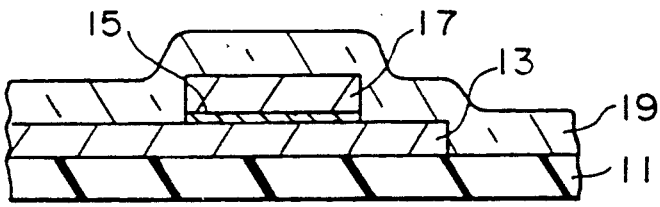
Figure 4H:
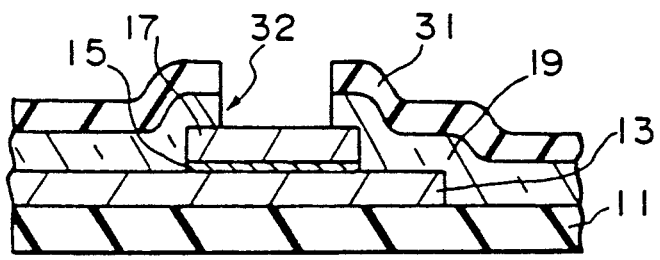

As shown in FIG. 4G, an SiO$_x$ insulation layer 19 is formed over the Josephson junction device by using a vapor deposition method in an O$_2$ atmosphere. Note, the vapor deposition method can be carried out at a low temperature.

Thereafter, a resist film 31 is formed onto the SiO$_x$ insulation layer 19, a resist mask is formed by developing the resist film, the SiO$_x$ insulation layer 19 is patterned by using the resist mask, and then an opening portion 32 on the upper Nb layer 17 is formed.

Note, an etching process of the SiO$_x$ insulation layer is, for example, carried out by using a plane parallel plate RIE apparatus under the condition of introducing CHF$_3$ gas of about 2.0 Pa (15 mTorr) including O$_2$ gas of 20% as etching gas, and of applying a high frequency (13.56 MHz) power of about 100 W between the plane parallel plate electrodes.

Figure 4I:
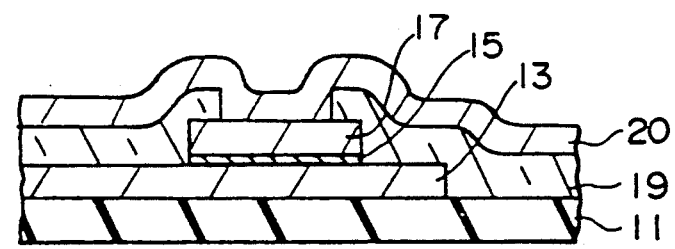

After forming the opening portion, as shown in FIG. 4I, an Nb layer 20, which is used as a wiring layer, is formed by using a magnetron sputtering method under the condition of an Ar gas pressure of 17 mTorr (2.3 Pa), a depositing speed of 150 nm/min. (1500 Å/min.), a direct current of 1.5 A, and in a stress-free state. Note, this Nb layer can be formed without heating the substrate.

Figure 4J:
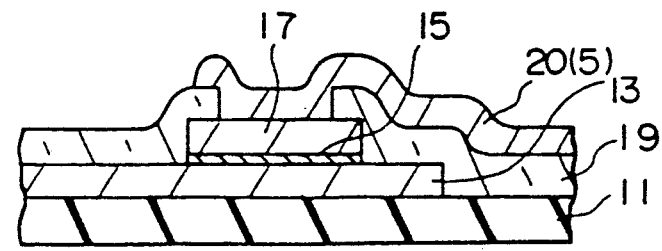

Thereafter, as shown in FIG. 4J, superconductor wirings (5) are formed by patterning the Nb layer 20. Furthermore, an insulation protective film can be formed over the surface thereof.

As described above, a Josephson junction apparatus can be formed on the polyimide film 11 having high thermal resistance and flexibility by using a low-temperature process.

Figure 5A:
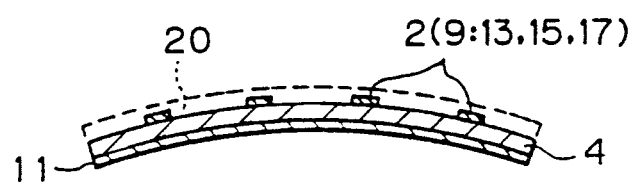
FIGS. 5A to 5C are explanatory diagrams indicating another example of a producing method of a Josephson junction apparatus according to the first aspect of the present invention.
Figure 5B:
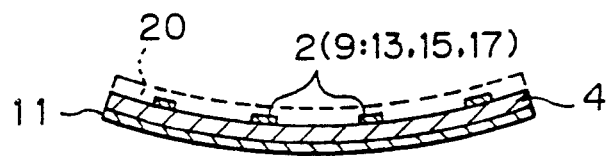
Figure 5C:

FIGS. 5A to 5C are explanatory diagrams indicating another example of a production method of a Josephson junction apparatus according to the first aspect of the present invention.

In the above described production method of a Josephson junction apparatus, a step of forming a laminated configuration portion 9, a step of etching the laminated configuration portion 9, and a step of forming a superconductor wiring layer 20 are carried out in a stress-free state. However, a condition of stress can be used to determine the shape of the Josephson junction apparatus, or the polyimide film 11.

Accordingly, another production method of a Josephson junction apparatus will be explained next. Note, only steps which are different from the above production method, which was described with reference to FIG. 4A to 4J, will be explained below. In the step of forming the laminated configuration portion 9, which is shown in FIG. 4A, when forming (depositing) the lower Nb layer 13, the $AlO_x$ barrier layer 15, and the upper Nb layer 17 by using a magnetron sputtering method under the condition of an Ar gas pressure of 10 mTorr (1.3 Pa), a depositing speed of 150 nm/min. (1500 Å/min.), a direct current of 1.5 A, the shape of the Josephson apparatus (shape of the polyimide film 11) is specified as a convex curved shape, as shown in FIG. 5A. In this case, the steps of forming a superconductor wiring layer 20 is carried out under the condition of an Ar gas pressure of 10 mTorr. Note, the step of etching the laminated configuration portion 9 need not be carried out under the condition of an Ar gas pressure of 10 mTorr.

Conversely, when depositing the lower Nb layer 13, the $AlO_x$ barrier layer 15, and the upper Nb layer 17 by using a magnetron sputtering method under the condition of an Ar gas pressure of 3.3 Pa (25 mTorr), a depositing speed of 150 nm/min. (1500 Å/min.), and a direct current of 1.5 A, the shape of the polyimide film 11 is specified as a concave curved shape, as shown in FIG. 5B. In this case, the steps of forming a superconductor wiring layer 20 is carried out under the condition of an Ar gas pressure of 3.3 Pa (25 mTorr). Note, the step of etching the laminated configuration portion 9 need not be carried out under the condition of an Ar gas pressure of 3.3 Pa (25 mTorr).

Still another production method of a Josephson junction apparatus will be explained. Note, only steps which are different from the above production method, which was described with reference to FIGS. 4A to 4J, will be explained below. In the step of forming a superconductor wiring layer (Nb layer) 20, which is shown in FIG. 4I, when forming (depositing) the Nb layer 20 by using a magnetron sputtering method under the condition of an Ar gas pressure of 1.3 Pa (10 mTorr), the shape of the Josephson apparatus (shape of the polyimide film 11) is specified as a convex curved shape, as shown in FIG. 5A. In this case, the steps of forming the laminated configuration portion 9 is carried out in a stress-free state (Ar gas pressure of 2.3 Pa (17 mTorr)).

Conversely, when depositing the Nb layer 20 by using a magnetron sputtering method under the condition of an Ar gas pressure of 3.3 Pa (25 mTorr), the shape of the polyimide film 11 is specified as a concaved curved shape, as shown in FIG. 5B. In this case, the steps of forming the laminated configuration portion 9 is carried out in a stress-free state (Ar gas pressure of 2.3 Pa (17 mTorr)).

In this case, as shown in FIG. 5C, the polymeric film 1 (polyimide film 11) should bond to a hard substrate 111 (for example, silicon substrate) by a preferable adhesive 110 until the Josephson junction apparatus is produced. Namely, before depositing a laminated configuration portion 9 on a polyimide film 11, the polyimide film 11 is previously connected to a silicon substrate 111 by using an adhesive 110. Further, after forming a superconductor wiring layer 20, the polyimide film 11 including a Josephson junction device 2 (or a Josephson junction apparatus) is peeled from the silicon substrate 111 by using a preferable solvent for dissolving the adhesive 110.

In the above embodiments, the superconductor is made of a niobium (Nb), but the superconductor can also be made of other superconductive materials such a NbN which is formed as a film by a low-temperature process.

Further, in the above embodiments, a film of the superconductor is formed by using a magnetron sputtering method, but the superconductive film can be formed by a vapor deposition method or another sputtering method. Additionally, in the above embodiment, it is explained that the $SiO_x$ insulation layer is formed by using a vapor deposition method in an $O_2$ atmosphere, but another method, for example, a plasma CVD method for depositing $SiO_2$ can be used.

Note, the polyimide film 11 is selected to physically support the Josephson junction device and to permit a specific bending characteristic. This Josephson junction apparatus formed on such a polyimide film can be placed on a curved surface.

In accordance with the first aspect of the present invention, as described above, a Josephson junction apparatus is produced to have flexibility, and thus the Josephson junction apparatus can be placed not only on a flat surface but it can also be placed on a curved surface in practice. Further, a flexible substrate has an adaptable characteristic, and thus it can be easily handled. Therefore, a Josephson apparatus formed in a high density configuration can be realized by folding the substrate using the adaptable characteristic thereof.

Figure 6A:
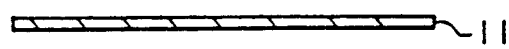
FIGS. 6A to 6C are explanatory diagrams indicating a problem in the related art.
Figure 6B:
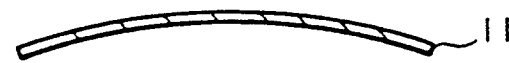
Figure 6C:

As described above, in manufacturing processes of the Josephson junction apparatus, especially, the photoresist pattern forming processes are carried out many times, and water or organic solvents, e.g., acetone and alcohol, are frequently used for removing the photoresist after the etching process. Note, in comparison with the other polymeric films, the functional polymeric film used for a substrate is difficult to dissolve in water or organic solvents, but the water or the organic solvents infiltrate into the functional polymeric film. Consequently, a problem may be caused that the functional polymeric film 11 having a flat shape and an exact size at an initial state, as shown in FIG. 6A, may be changed to the functional polymeric film 11 having a needless extension or a needless warp, which is shown in FIGS. 6B or 6C, so that a dimensional discrepancy in a junction pattern may occur. Additionally, in a highly sensitive magnetic sensor, a minute junction and a minute pattern are required, and thus a low level dimensional discrepancy can be a great obstacle.

Next, a principle of a second aspect of the present invention will be explained.

Figure 7:
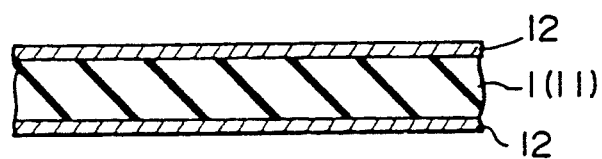
FIG. 7 is an explanatory diagram of a principle according to a second aspect of the present invention.

FIG. 7 is an explanatory diagram of a principle according to a second aspect of the present invention.

In FIG. 7, reference numeral 1(11) denotes a functional polymeric film, and 12 denotes a protective film. In order to solve the above problems, it is important that the functional polymeric film is not directly contacted by water or organic solvents during the manufacturing process.

Therefore, as shown in FIG. 7, before forming a Josephson junction (laminated configuration portion 9), the protective film 12 is formed over both sides of the functional polymeric film 11 by using a vapor deposition method, a sputtering method, or a CVD method. Namely, the protective film 12, which is a silicon oxide for protecting against wetting caused by water or organic solvents, is formed over the functional polymeric film 11. Note, in this case, the protective film 12 should be deposited over both sides of the functional polymeric film 11. For example, when depositing the protective film 12 onto one side of the functional polymeric film 11, a warpping of the functional polymeric film may be made larger.

In the second aspect of the present invention, the protective film 12 is formed over both sides of the functional polymeric film 11, and the functional polymeric film 11 is not directly contacted by the water or the organic solvents during the processes for forming the Josephson junction device, so that wetting of the functional polymeric film 11 caused by the water or the organic solvents can be prevented. Therefore, a dimensional discrepancy of a pattern is not caused, and reliability of the pattern can be increased when forming a minute Josephson junction device.

FIGS. 8A to 8G are cross-sectional diagrams indicating continuous processes of an embodiment of the second aspect of the present invention.

In FIGS. 8A to 8G, reference numeral 11 denotes a polyimide film, 12 denotes an $SiO_x$ film, 13 denotes an Nb film, 15 denotes an $AlO_x$ film, 17 denotes an Nb film, 9 denotes a Josephson junction (laminated configuration portion), 27 denotes a first photoresist, 29 denotes a second photoresist, 19 denotes an $SiO_x$ film, 31 denotes a third photoresist, 32 denotes an opening portion, 20 denotes an Nb wiring, and 33 denotes a fourth photoresist. Note, $SiO_x$ indicates a silicon oxide of the states from SiO to $SiO_2$, and thus X is specified as $1 < X < 2$.

Note, an example of forming the laminated configuration portion constituted by a lower Nb layer 13, an $AlO_x$ barrier layer 15, and an upper Nb layer 17 (Nb/$AlO_x$/Nb layers) onto a substrate constituted by the polyimide film 11 whose thickness is specified at about 50 μm will be explained later.

The next table indicates relationships between the thickness of the protective films made of $SiO_x$ and the numbers of pin-holes in the protective films. Note, as shown in the following table, the protective film of $SiO_x$ is formed by vapor-depositing under the condition of vacuum pressure, and the protective film of $SiO_x$ is formed by vapor-depositing under the condition of vacuum pressure of $1 \times 10^{-4}$ Torr and the $O_2$ atmosphere.

As shown in the above table, the number of pin-holes of the $SiO_x$ can be decreased when the thickness thereof is specified to 300 nm (3000 Å).

Figure 8A:
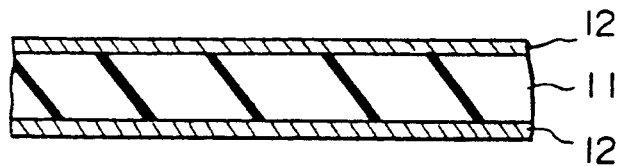
FIGS. 8A to 8G are cross-sectional diagrams indicating continuous processes of an embodiment of the second aspect of the present invention.

As shown in FIG. 8A, the $SiO_x$ film 12 as a protective film is vapor-deposited at the thickness of 300 nm (3000 Å) onto a front face of the polyimide film 11 as a functional polymeric film under the condition of vacuum pressure of $1 \times 10^{-4}$ Torr and $O_2$ atmosphere. Further, the $SiO_x$ film 12 as the protective film is vapor-deposited at the thickness of 300 nm (3000 Å) onto a back face of the polyimide film 11 by using the same method.

Figure 8B:
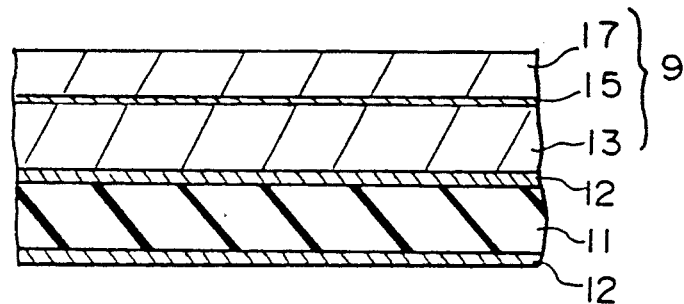

Next, as shown in FIG. 8B, the Nb film 13 as a lower electrode is deposited at the thickness of 200 nm (2000 Å) onto the polyimide film 11 under the condition of argon (Ar) gas pressure of 1.3 Pa (10 m Torr) by using a sputtering method, and then, an Al film is deposited at the thickness of 7 nm (70 Å) under the condition of Ar gas pressure of 1.3 Pa (10 m Torr). Further, for example, $O_2$ gas is introduced into the Ar gas up to a rate of 10%, and the Al film is oxidized for one hour under the Ar gas pressure of 90 Pa (0.7 Torr) including the 10% of $O_2$ gas. Next, the Nb film 17 as an upper electrode is deposited at the thickness of 150 nm (1500 Å) by using the same method of depositing the lower electrode, so that the Josephson junction of the Nb/$AlO_x$/Nb layers is formed.

Figure 8C:
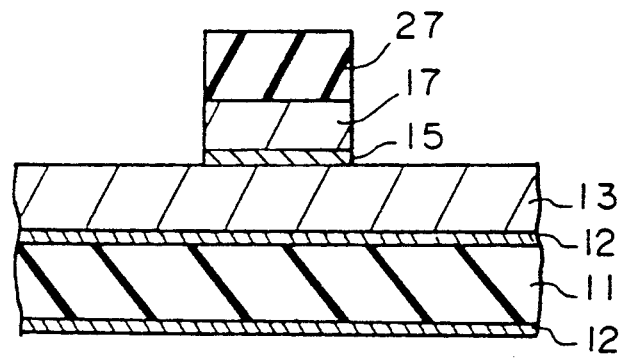

As shown in FIG. 8C, the Nb film of the upper electrode is patterned by using the first photoresist 27 as a mask, and useless niobium Nb is removed by an RIE method by using carbon tetrafluoride($CF_4$)−5% $O_2$ gas under the gas pressure of 50 m Torr and applying a high frequency (13.56 MHz) power of 50 W.

Continuously, without removing the first photoresist 27, a barrier layer of the $AlO_x$ film 15 is removed by using a sputtering etching method in the Ar gas atmosphere.

Figure 8D:
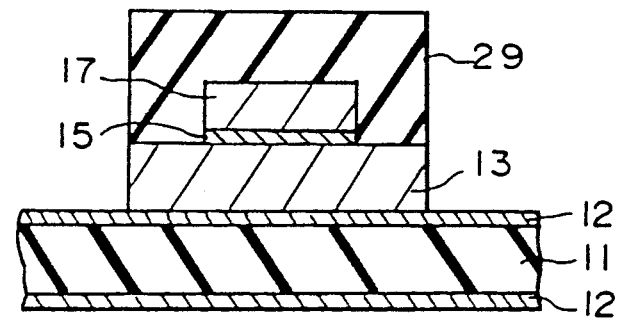

As shown in FIG. 8D, the Nb film 13 is etched by using the second photoresist 29 as a mask and by using the RIE method in the same way as the above, so that the lower electrode is formed.

Figure 8E:
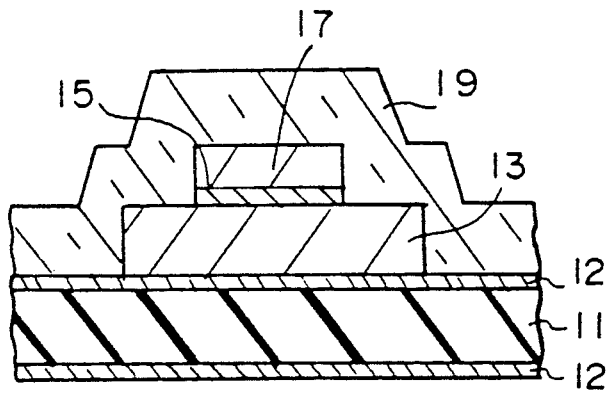
Figure 8F:
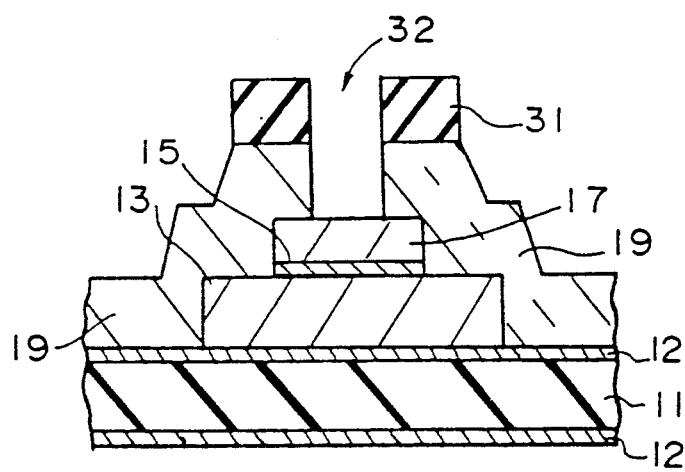

Next, as shown in FIG. 8E, for example, after vapor-depositing the $SiO_x$ film 19 at the thickness of 350 nm (3500 Å) under the condition of vacuum pressure of $1 \times 10^{-4}$ Torr and the $O_2$ atmosphere, as shown in FIG. 8F, a contact pattern is formed by using the third photoresist 31 as a mask. Further, the opening portion 32 is formed by the RIE method of removing the $SiO_x$ film 19 by using trifluoride methane($CHF_3$)−20% $O_2$ gas under the gas pressure of 2.0 Pa (15 m Torr) and applying a high frequency (13.56 MHz) power of 100 W.

Figure 8G:
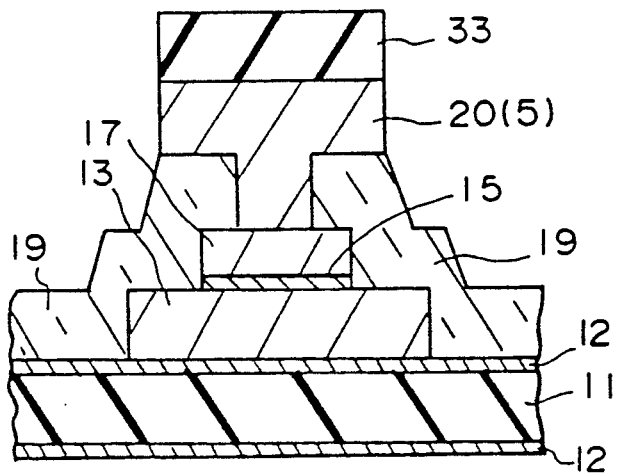

Finally, as shown in FIG. 8G, the Nb film 20 of 600 nm (6000 Å) is deposited by using the same method as in the above description, and the Nb film 20 is etched by using the fourth resist 33 as a mask, so that the Nb wiring 20 is formed and the Josephson junction device or the Josephson junction apparatus is completed.

In the above embodiments, the $SiO_x$ film 12 is formed on both sides of the functional polymeric film 11 to protect the functional polymeric film 11 against a wetting of the functional polymeric film 11 caused by water or organic solvents being used many times during the

| deposition | | thickness: 100 nm (1000 Å) | thickness: 300 nm (3000 Å) |
|---|---|---|---|
| $SiO_x$ | $O_2$ atmosphere $1 \times 10^{-4}$ Torr | 60 pieces/cm² | 2∼3 pieces/cm² | number of pin-holes: pieces/cm² manufacturing process. Note, the protective film 12 covering both sides of the functional polymeric film can be made of fluoride, e.g., calcium fluoride ($CaF_2$), barium fluoride ($BaF_2$), magnesium fluoride ($MgF_2$), and the like. These fluorides $CaF_2$, $BaF_2$, or $MgF_2$ are sufficient for protecting the functional polymeric film by forming a thickness of about 100 nm (1000 Å) onto the functional polymeric film. Note, for example, these fluoride protective films are stable against an etching gas of $CF_4$ which is used in the process described with reference to FIG. 8C. Additionally, the fluoride protective films $BaF_2$ and $MgF_2$ can be more easily deposited than the fluoride protective film $CaF_2$ onto the functional polymeric film in accordance with their vapor pressures.

Furthermore, in the above described embodiment, similar to the first aspect of the present invention, a polyimide film is used as a functional polymeric film, in addition to this, an aramid film, a polyphenylenesulfite (PPS) film, a polyetheretherketone (PEEK) film, a polyethyleneterephthalate (PET) film, and the like can be used as the functional polymeric film.

In accordance with the second aspect of the present invention as described above, when a functional polymeric film is used as a substrate of a Josephson junction apparatus, a protective film is previously formed over the functional polymeric film, so that a wetting of the functional polymeric film, which is caused by water or organic solvents being used many times during the manufacturing process, can be prevented and a dimensional stability of the film can be increased. Therefore, a minute Josephson junction device can be formed onto the polymeric film without causing a dimensional discrepancy in a pattern, and thus a reliability thereof can be increased.

Many widely differing embodiments of the present invention may be constructed without departing from the spirit and scope of the present invention, and it should be understood that the present invention is not limited to the specific embodiments described in this specification, except as defined in the appended claims.

I claim:

1. A method of producing a Josephson junction apparatus comprising;
    a step of providing a polymeric film, having thermal resistance and flexibility;
    a step of physically depositing a laminated configuration portion constituted by a first superconductor layer, a barrier layer, and a second superconductor layer on said polymeric film at a specified temperature below the temperature at which a loss of said thermal resistance of said polymeric film and of a stress-free state occurs, without heating said polymeric film;
    a step of forming a Josephson junction device by selectively etching said laminated configuration portion at a specified temperature below the temperature at which a loss of said thermal resistance and of a stress-free state occurs; and
    a step of forming a superconductor wiring layer for connecting said Josephson junction device at a specified temperature below the temperature at which a loss of said thermal resistance and of a stress-free state occurs.

2. A method of producing a Josephson junction apparatus as claimed in claim 1, wherein said polymeric film is constituted by a functional polymeric film.

3. A method of producing a Josephson junction apparatus as claimed in claim 2, wherein said functional polymeric film is made of polyimide.

4. A method of producing a Josephson junction apparatus as claimed in claim 3, wherein the thickness of said polymeric film is specified from 7.5 μm to 125 μm.

5. A method of producing a Josephson junction apparatus as claimed in claim 2, wherein said functional polymeric film is made of polyether ether ketone, polyphenylene sulfite, aramid, or polyethylene terephthalate.

6. A method of producing a Josephson junction apparatus as claimed in claim 1, wherein said producing method further comprises a step of forming a protective film over both sides of said polymeric film for protecting against wetting of said polymeric film caused by water or organic solvents, before the step of physically depositing said laminated configuration portion.

7. A method of producing a Josephson junction apparatus as claimed in claim 6, wherein said protective film is made of silicon oxide.

8. A method of producing a Josephson junction apparatus as claimed in claim 7, wherein the thickness of said protective film is specified at about 300 nm.

9. A method of producing a Josephson junction apparatus as claimed in claim 6, wherein said protective film is made of calcium fluoride, barium fluoride, or magnesium fluoride.

10. A method of producing a Josephson junction apparatus comprising;
    a step of providing a polymeric film, having thermal resistance and flexibility;
    a step of bonding said polymeric film to a hard substrate by using an adhesive;
    a step of physically depositing a laminated configuration portion constituted by a first superconductor layer, a barrier layer, and a second superconductor layer on said polymeric film at a specified temperature below the temperature at which a loss of said thermal resistance of said polymeric film occurs, without heating said polymeric film;
    a step of forming a Josephson junction device by selectively etching said laminated configuration portion at a specified temperature below the temperature at which a loss of said thermal resistance occurs;
    a step of forming a superconductor wiring layer for connecting said Josephson junction device at a specified temperature below the temperature at which a loss of said thermal resistance occurs and by applying stress; and
    a step of peeling said polymeric film from said hard substrate by dissolving said adhesive.

11. A method of producing a Josephson junction apparatus as claimed in claim 10, wherein said step of depositing said laminated configuration portion includes the condition of applying a stress to obtain a curved polymeric film.

* * * * *